United States Patent
Robertson et al.

(10) Patent No.: US 7,247,209 B2
(45) Date of Patent: Jul. 24, 2007

(54) DUAL OUTLET NOZZLE FOR THE COMBINED EDGE BEAD REMOVAL AND BACKSIDE WASH OF SPIN COATED WAFERS

(75) Inventors: Gary Robertson, Wemyss Bay (GB); Robert Boyd Finlay, Larkhall (GB)

(73) Assignee: National Semiconductor Corporation, Santa Clara, CA (US)

( * ) Notice: Subject to any disclaimer, the term of this patent is extended or adjusted under 35 U.S.C. 154(b) by 366 days.

(21) Appl. No.: 10/461,068

(22) Filed: Jun. 12, 2003

(65) Prior Publication Data

US 2004/0250839 A1  Dec. 16, 2004

(51) Int. Cl.
*B08B 3/02* (2006.01)
*B08B 7/00* (2006.01)

(52) U.S. Cl. .............. 134/33; 134/34; 134/36; 134/902

(58) Field of Classification Search .............. 134/32, 134/33, 902, 34, 36
See application file for complete search history.

(56) References Cited

U.S. PATENT DOCUMENTS

| | | | |
|---|---|---|---|
| 4,113,492 A | 9/1978 | Sato et al. | 430/271.1 |
| 4,668,334 A | 5/1987 | Doornveld | 438/695 |
| 4,732,785 A | 3/1988 | Brewer | 438/748 |
| 5,294,257 A | 3/1994 | Kelly et al. | 118/52 |
| 5,444,921 A | 8/1995 | Milina | 33/833 |
| 5,688,411 A | 11/1997 | Kutsuzawa et al. | 216/92 |
| 5,718,763 A | 2/1998 | Tateyama et al. | 118/52 |
| 5,868,843 A | 2/1999 | Yang et al. | 118/504 |
| 5,911,090 A | 6/1999 | Orth | 396/611 |
| 5,939,139 A | 8/1999 | Fujimoto | 427/240 |
| 5,952,045 A | 9/1999 | Bossart | 438/758 |
| 5,952,050 A | 9/1999 | Doan | 427/336 |
| 6,033,988 A | 3/2000 | Hirano | 438/694 |
| 6,062,288 A | 5/2000 | Tateyama | 156/584 |
| 6,558,478 B1 * | 5/2003 | Katakabe et al. | 134/33 |

* cited by examiner

*Primary Examiner*—Michael Barr
*Assistant Examiner*—Saeed T. Chaudhry
(74) *Attorney, Agent, or Firm*—Beyer Weaver LLP

(57) ABSTRACT

An apparatus and method for the improved combined edge bead removal and backside wash of spin coated semiconductor wafers is disclosed. This is preferably accomplished by providing a nozzle having a plurality of outlets adapted for the ejection of a cleaning fluid onto the backside of a semiconductor wafer. This cleaning fluid can be EEP or a similar EBR type of solvent. This dual outlet nozzle can be mounted to a stationary EBR arm, and preferably comprises two outlets located on a beveled top surface that are separated at a predetermined angle. The angle of this beveled top surface with respect to a horizontal plane of the processed wafer is preferably about 45 degrees, while the angle of each nozzle outlet with respect to a primary axis of the stationary EBR arm is also preferably about 45 degrees. Other angles are also possible in order to maximize solvent jet efficiency.

17 Claims, 4 Drawing Sheets

DUAL OUTLET NOZZLE FOR THE COMBINED EDGE BEAD REMOVAL AND BACKSIDE WASH OF SPIN COATED WAFERS

TECHNICAL FIELD

The present invention relates generally to an apparatus and method for the manufacturing of integrated circuit devices, and more specifically to an apparatus and method for the cleaning of spin coated wafers during the manufacturing process.

BACKGROUND

In most conventional integrated circuit (IC) manufacturing processes, a semiconductor wafer to be processed is placed inside a process chamber and atop a chuck, where it is typically held in place. Such chucks typically have a diameter that is slightly less than that of the semiconductor wafer, such that the wafer can overhang the chuck by a small amount around the entire circumference of the chuck surface. Prior to processing, the semiconductor wafer is usually positioned on the chuck such that the center of the wafer lies on or near the center of the chuck, with both the wafer and the chuck residing in substantially parallel horizontal planes. One surface of the wafer, which is designated as the bottom or inactive side, is the one that is placed in contact with the chuck, while the opposite top surface is designated as the active surface to be processed.

Processing of the wafer can be accomplished via a variety of techniques and methods well known in the art, such as various CVD, PVD, spray and spin coating procedures. During a typical spin coating procedure, for example, which is usually performed through use of a rotating chuck, one or more coating materials are applied to the semiconductor wafer by flowing at least one liquid coating material onto the top surface of the wafer while it is spinning. As the chuck rotates, a liquid coating material, such as a photoresist, is then applied at the wafer center. The centrifugal force of the rotating wafer then causes the liquid coating material to spread radially outward from the center of the wafer towards the edge, such that the top of the wafer is substantially evenly coated with the liquid coating material.

Photoresist, polyamide, and other spin-coated materials are typically spun onto the semiconductor wafer in a sticky form, which when dried becomes brittle, such that the material has a tendency to crack, chip, flake or even shatter where the spun on film is too thick. Although such effects can result in defects in the finished wafer, film thickness for the majority of the wafer is usually controlled throughout the spin on operation and in a subsequent drying or heat treatment step. This is not usually the case, however, for any spun on liquid that travels to the edge of the wafer or to the wafer backside. While it is desirable that excess coating material be ideally ejected or sucked away from the edge of the wafer, more often than not some coating material will invariably collect at and form a bead along the edge of the wafer.

On occasion, excess coating material may even curl around and under the wafer to collect and rest along the backside of the wafer. These "edge beads" and "backside deposits," as they are called, tend to be irregular by nature, and if not accounted for will almost invariably result in the kind of cracking, chipping and flaking that accompanies a coating film that is too thick or otherwise irregular. Furthermore, any coating material that has crept around to the backside of the wafer during the spin coating process can not only become a source of particulate contamination, but can also prevent proper leveling and focusing of a lithography tool during any potential subsequent photoexposure step.

Accordingly, a common follow up step after any spin coat step or steps in the wafer manufacturing process is to dispense a solvent, such as ethoxypropanol (EEP) at or near the edge of the wafer to dissolve the edge bead and remove any photoresist or other undesirable coating from the edge and/or backside of the wafer. Although some wafer processing systems, such as those employing a frustraconical or similar catch cup design, do not require backside wafer cleaning, virtually all systems and techniques do require at least an edge bead removal or similar process step. In such an "edge bead removal," "backside wash," and/or "wet edge bead operation" cleaning step, a solvent is typically sprayed via nozzle to the bottom and/or top surfaces of the wafer near the outer edge while the wafer is spinning. This solvent, which is sometimes referred to as edge bead removal (EBR) fluid or solvent, can be sprayed onto the backside edge of the wafer, in which case it usually spreads outward and curls up and around to the top of the wafer to dissolve the edge bead during a spray and spin process. Alternatively, this solvent can be dispensed directly onto the top edge of the wafer, whereby it usually spreads outward and curls around toward the bottom of the wafer to dissolve the edge bead.

Various apparatuses and methods for depositing a spin coated film on a semiconductor wafer and cleaning up edge beads and backside deposits are well known, and instances of such apparatuses and methods can be found, for example, in U.S. Pat. Nos. 6,062,288; 6,033,988; 5,952,050; 5,952,045; 5,939,139; 5,911,090; 5,868,843; 5,718,763; 5,688,411; 5,444,921; 5,294,257; 4,732,785; 4,668,334; and 4,113,492, for example, all of which are incorporated herein by reference in their entirety. As mentioned in some of these references and elsewhere, one or some combination of one or more top and bottom nozzles as outlined above is frequently employed for purposes of edge bead removal and backside wash. In most such cases, however, such processes allow solvent and dissolved photoresist to be splashed about, which often leaves an undesirably jagged edge profile on the photoresist or other coating material, which in turn tends to result in wafer defects at those locations.

In addition, the use of only one nozzle is often insufficient to provide enough solvent over enough of an area to result in an adequately complete backside wash and edge bead removal for an entire wafer. Furthermore, most semiconductor wafers are not perfectly round, as many have one or more flattened areas or "flats" along the outer circumference in order to better facilitate other steps of the wafer manufacturing process. Such a flat on a wafer is a region that is particularly susceptible to irregularities in spin coated films, and many edge bead removal and backside wash techniques do little or nothing to account for the irregular nature of the "flat" region of a wafer. As a result, edge beads tend to be more prevalent in such regions, with the accompanying rise in wafer defects as well.

Accordingly, there exists a need for improved apparatuses and methods for cleaning semiconductor wafers during and after the processing of same, and more particularly, for such apparatuses and methods to provide better and more reliable results in an edge bead removal and backside wash process, especially at or near the flat regions of such wafers.

SUMMARY

It is an advantage of the present invention to provide an apparatus and method for obtaining better and more reliable results in an edge bead removal and backside wash process, especially at the flat region of a semiconductor wafer. It is thus one object of the present invention generally to increase the effectiveness of conventional edge bead removal and backside wash systems. It is another object to control solvent and particle splashing during the process of removing any edge beads and backside deposits from the coating material. It is a further object to improve the edge profile of the coating material, especially at the wafer flat.

These and other objects and advantages may be achieved by utilizing an improved apparatus and method for dispensing EBR solvent onto a semiconductor wafer. According to one embodiment, a specialized nozzle having a plurality of outlets is used, with use of such a nozzle precluding any need for multiple nozzles in different positions. In one embodiment, such a specialized nozzle has two outlets set apart at a fixed angle with respect to each other. This nozzle can be advantageously installed onto an edge bead removal arm extending laterally from a chuck column, and is preferably installed at an orientation such that one outlet sprays solvent at the wafer backside toward the intersection of chuck and wafer backside, while the other outlet sprays solvent at the wafer backside toward the wafer edge, but within the shortest circumference of the wafer possible as dictated by the wafer flat.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures for the disclosed inventive apparatus and method for edge bead removal and cleaning of IC wafers. These drawings in no way limit any changes in form and detail that may be made to the invention by one skilled in the art without departing from the spirit and scope of the invention.

DETAILED DESCRIPTION

An example application of an apparatus and method according to the present invention is described in this section. This example is being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following example should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

One advantage of the present invention is the realization of more reliable results in a combined edge bead removal and backside wash process for a spin coated semiconductor wafer, which results in fewer wafer defects, particularly at the wafer flat region. Another advantage of the present invention is that, through use of a specialized nozzle having a plurality of outlets, the need for multiple nozzles in different positions is obviated. Such a resulting need for fewer nozzles is particularly advantageous in that additional EBR arms and supports, as well as EBR cleaning fluid delivery channels are also not needed. Other advantages will also be or become apparent upon examination of the figures and detailed description disclosed herein.

Figure 1:
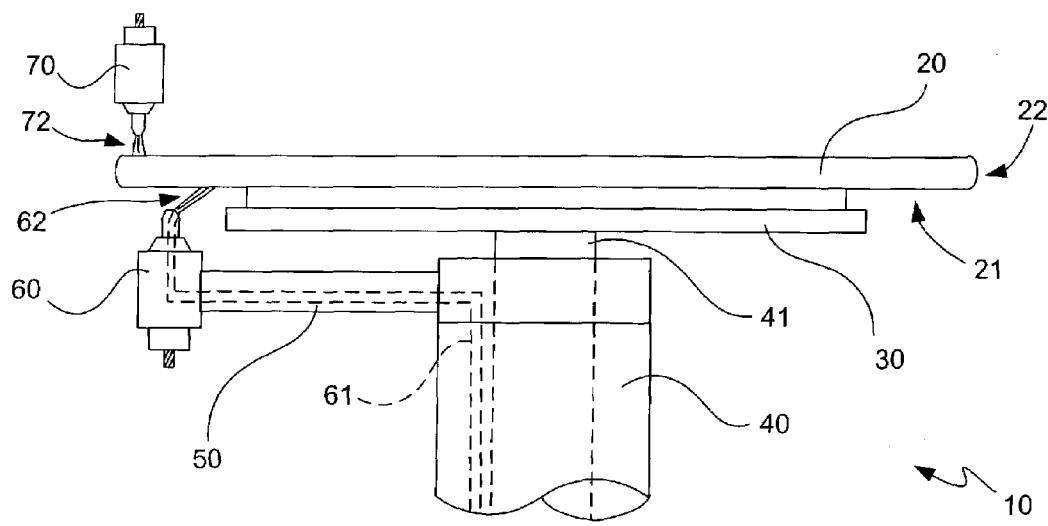
FIG. 1 illustrates in side elevation view an exemplary edge bead removal and backside wash system for use in a semiconductor wafer manufacturing process.

Turning first to FIG. 1, an exemplary edge bead removal and backside wash system for use in a semiconductor wafer manufacturing process is illustrated in side elevation view. Edge bead removal and backside wash system 10 is adapted for use with semiconductor wafer 20 being processed, such that the semiconductor wafer backside 21, semiconductor wafer edge 22, and/or wafer flat (not shown) can be cleaned after a processing step, such as a spin coating process step. Semiconductor wafer 20 is held in place atop chuck 30, preferably by vacuum, which chuck is at least indirectly supported by stationary chuck support 40. Stationary chuck support 40 preferably comprises a motor driven axle 41 that is adapted to rotate at relatively high speeds, such that chuck 30 and wafer 20 are also rotated at relatively high speeds.

An edge bead removal stationary arm 50 extends laterally from stationary chuck support 40, with such an EBR arm being adapted to support a standard backside edge bead removal nozzle 60. An EBR cleaning fluid delivery line 61 passes along or through backside nozzle 60, EBR arm 50 and/or stationary chuck support 40, such that EBR cleaning fluid or solvent can be delivered to the nozzle outlet. Once cleaning fluid reaches the nozzle outlet, it exits the nozzle and is dispensed onto wafer backside 21 in the form of a backside cleaning fluid or solvent jet 62. In addition, a standard topside edge bead removal nozzle 70 is positioned above wafer 20 by an external support means (not shown). This topside nozzle 70 is also fed by a separate EBR cleaning fluid delivery line (not shown), whereby cleaning fluid reaching the nozzle outlet is dispensed onto the topside of the wafer near the edge in the form of a topside cleaning fluid or solvent jet 72. While backside nozzle 60 and topside nozzle 70 are shown as being in the same general vicinity, it is also possible for one or the other to be located elsewhere along the surface of the wafer. It is also possible to utilize more than two nozzles, in instances where even more cleaning fluid jets are desired.

Figure 2:
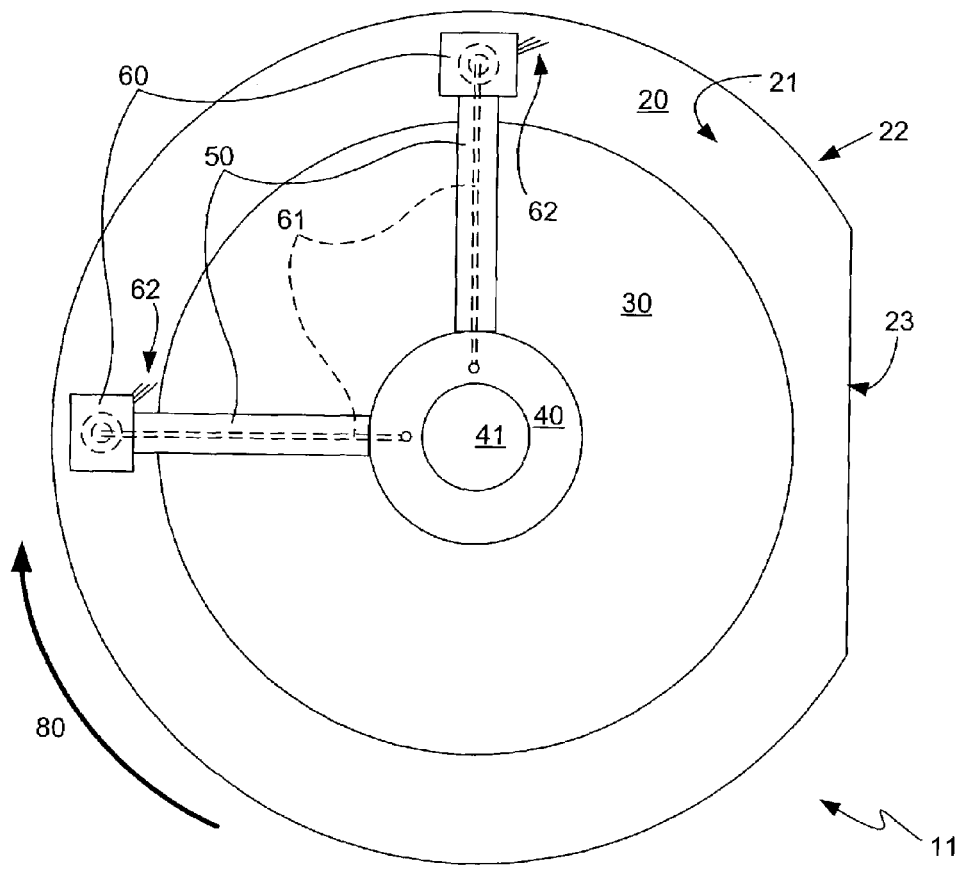
FIG. 2 illustrates in bottom plan view an alternative exemplary edge bead removal and backside wash system for use in a commercial semiconductor wafer manufacturing process.

Referring now to FIG. 2, an alternative exemplary edge bead removal and backside wash system for use in a commercial semiconductor wafer manufacturing process is illustrated in bottom plan view. Alternative edge bead removal and backside wash system 11 is similarly adapted for use with a semiconductor wafer 20 being processed, such that the semiconductor wafer backside 21, semiconductor wafer edge 22, and/or semiconductor wafer flat 23 can be cleaned after a processing step, such as a spin coating process step. As in the foregoing system, semiconductor wafer 20 is held in place atop chuck 30, which is supported by a stationary chuck support 40. A motor driven axle 41 is similarly adapted to rotate at relatively high speeds, such that chuck 30 and wafer 20 are also rotated at relatively high speeds, both in rotation direction 80 with respect to the remaining system components.

Unlike the foregoing system, however, at least two EBR stationary arms 50 extend laterally from stationary chuck support 40, with each such EBR arm being adapted to support at least one standard backside edge bead removal nozzle 60. EBR cleaning fluid delivery lines 61 pass along or through each backside nozzle 60 and EBR arm 50, as well as stationary chuck support 40, such that EBR cleaning fluid can be delivered to the outlet of both backside nozzles. Once cleaning fluid reaches the nozzle outlets, it exits the nozzles and is dispensed onto wafer backside 21 in the form of two separate backside cleaning fluid or solvent jets 62. Each nozzle can be independently adjusted and manipulated, such that each backside solvent jet 62 can be dispersed in an optimum manner. Additional EBR arms can also be added, as well as topside nozzle supports, if desired, although such additions can become cost prohibitive after a sufficient number have been added.

Figure 3:
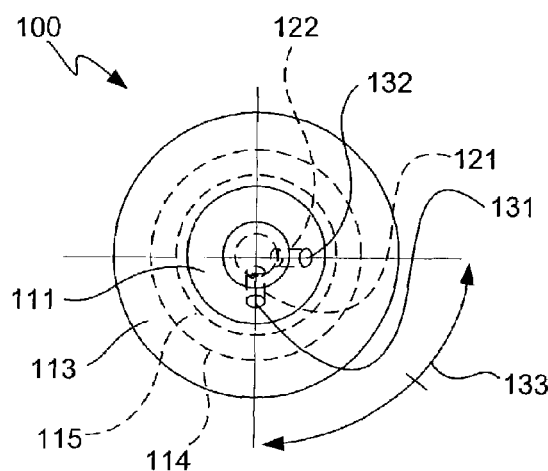
FIG. 3 illustrates in top plan view a dual outlet nozzle for use in an edge bead removal and backside wash system according to one embodiment of the present invention.
Figure 4:
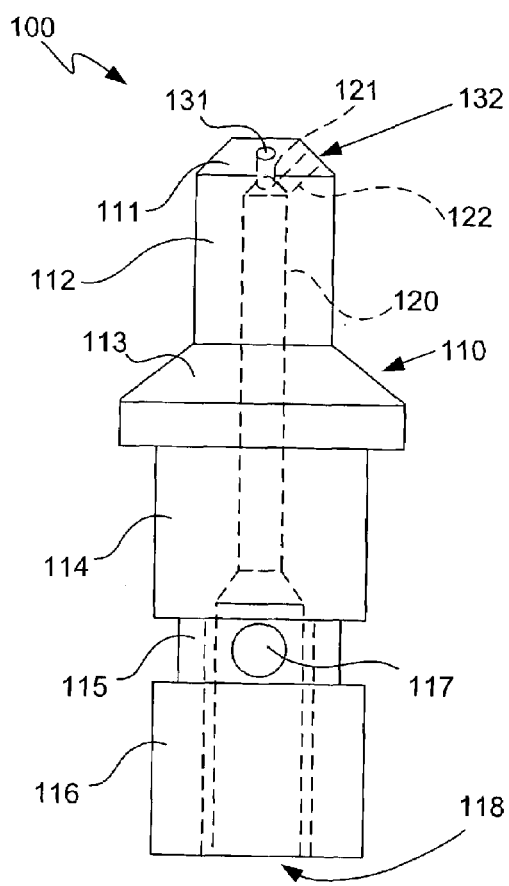
FIG. 4 illustrates in front elevation view the dual outlet nozzle of FIG. 3.
Figure 5:
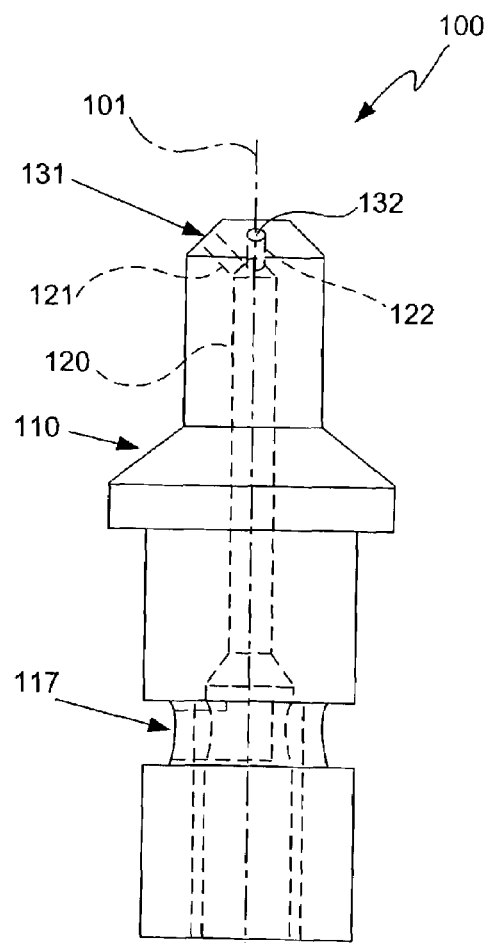
FIG. 5 illustrates in side elevation view the dual outlet nozzle of FIG. 3.
Figure 6:
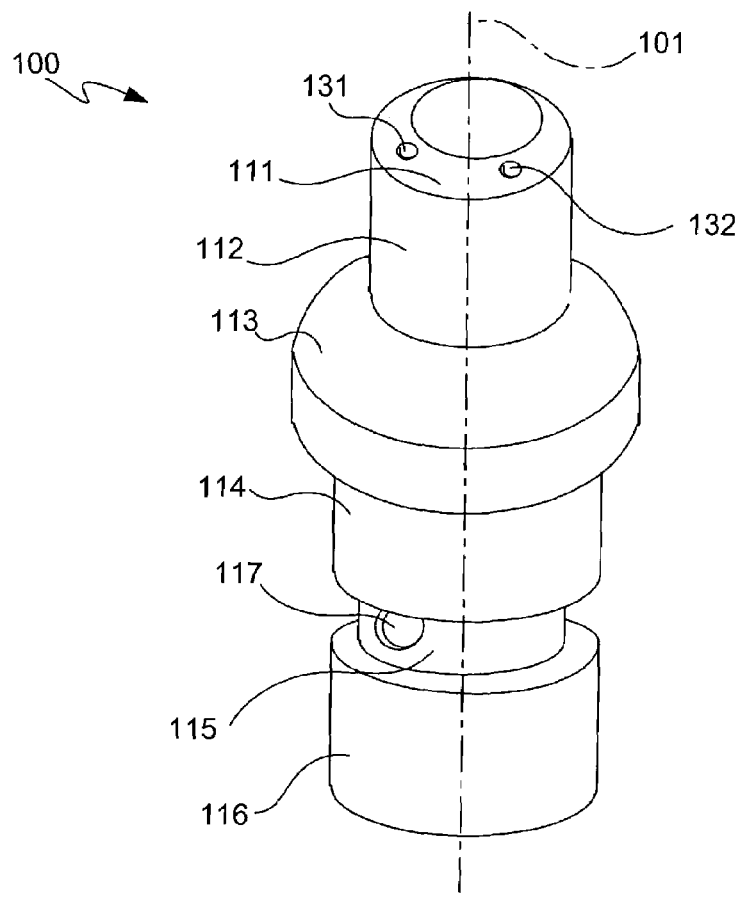
FIG. 6 illustrates in side perspective view the dual outlet nozzle of FIG. 3.

Turning now to FIGS. 3-6, a dual outlet nozzle for use in an edge bead removal and backside wash system according to one embodiment of the present invention is illustrated. In FIG. 3, the inventive dual outlet nozzle is shown in top plan view, while in FIGS. 4 and 5, the same dual outlet nozzle is shown in front elevation and side elevation views respectively. In addition, the same dual outlet nozzle is also shown in a side perspective view in FIG. 6.

Dual outlet nozzle 100 comprises a primary longitudinal axis 101, as well as a number of features generally along and associated with an outer surface 110. Such features include a beveled top surface 111, an extended body region 112, a conically-shaped flange 113, an upper body base 114, a recessed mid body base 115, a lower body base 116, at least one fluid inlet hole 117, and one or more mounting openings 118. Exact dimensions for each of these features can vary, as desired, with dimensions for features such as flange 113, recessed mid body base 115, and one or more mounting openings 118 being largely dependent on, for example, the desired fit of the entire nozzle within or on an EBR or other stationary arm and/or with a cleaning fluid delivery line. Feature dimensions and alterations to effect such a fit or attachment to an EBR or other stationary arm and cleaning fluid delivery line can be adjusted as necessary, such that nozzle 100 is appropriately configured to be mounted to and useful with any particular arm and/or cleaning fluid line as desired through techniques and attachment devices that are readily known to those skilled in the art.

Dual outlet nozzle 100 also comprises at least one primary internal flow channel 120, through which cleaning fluid is delivered. Such cleaning fluid can be a chemical solvent, and is preferably EEP, although other chemical solvents, cleaning fluids or agents, and even water can also be used. In addition to EEP, such other chemical solvents can include isopropyl alcohol, acetone, and propylene glycol, for example, the use of any of which is also contemplated by the present invention. Toward its end near the top of the nozzle, internal flow channel 120 forks into a plurality of outlet flow channels. In one particular embodiment, internal flow channel 120 forks into a first or frontal outlet flow channel 121 and a second or side outlet flow channel 122. Each of these outlet flow channels ends at a nozzle outlet, with first or frontal outlet flow channel 121 ending at first or frontal outlet 131, and second or side outlet flow channel 122 ending at second or side outlet 132, whereupon cleaning fluid or solvent is then ejected from the nozzle into a fluid jet. Additional outlet flow channels and outlets can also be implemented in nozzle 100, and the use of any such number of additional outlet flow channels and outlets is also contemplated for use in conjunction with the present invention.

According to one embodiment of the present invention, internal flow channel 120 proceeds along a path that is substantially parallel to primary nozzle axis 101, although alternative flow channel paths may also be employed. In addition, one or more outlet flow channels are formed such that a diverging angle is formed with respect to the direction of the primary internal flow channel. For example, one or more of such outlet flow channels can be formed at an angle of about 45 degrees with respect to the primary flow channel. Also, one or more of the actual nozzle outlets can be formed on beveled top surface 111, with the angle of the beveled top surface preferably being optimally created such that the outlet opening is substantially circular in nature. In the embodiment specifically illustrated, such an angle of the beveled top surface 111 with respect to primary nozzle axis 101 is about 45 degrees, although it will also be appreciated that other alternative angles and outlet shapes having varying degrees of effectiveness are also possible.

In the particular embodiment of the present invention illustrated, exactly two outlet flow channels 121, 122 and two outlet holes 131, 132 are created in nozzle 100, with these two outlet flow channels and outlet holes being separated by a fixed angle 133. Such a fixed angle can be designed to result in a pair of cleaning fluid jets set apart by a useful distance and direction for a more effective EBR and backside wash process step, with one example of such a fixed angle 133 being about 90 degrees. Other fixed angles may also be determined to be useful, depending upon such variables as the strength of the cleaning fluid, the power and volume of the cleaning fluid jets, the orientation of the nozzle outlets and the rotational speed of the spinning wafer, for example, and all such alternative fixed angles between outlet flow channels and holes are also contemplated.

Figure 7:
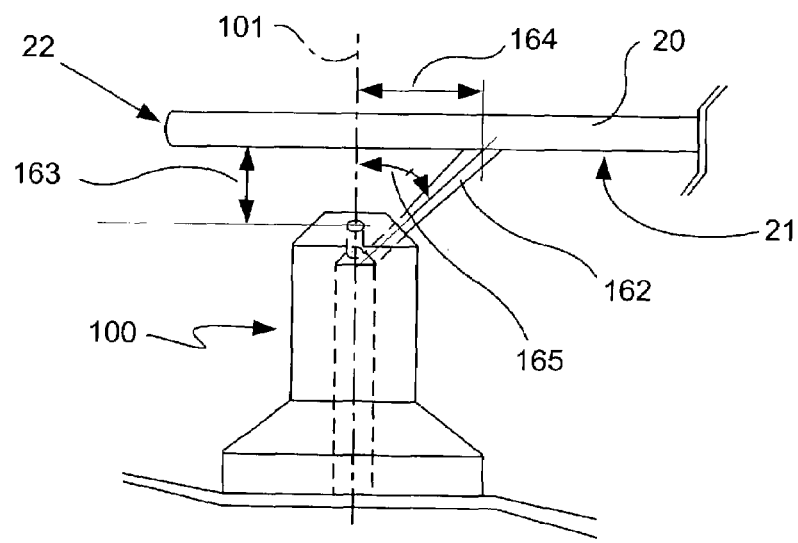
FIG. 7 illustrates in partial side elevation view the dual outlet nozzle of FIG. 3 in operation within an edge bead removal and backside wash system according to one embodiment of the present invention.

Referring now to FIG. 7, the inventive dual outlet nozzle of FIGS. 3-6 is shown in partial side elevation view in operation within an edge bead removal and backside wash system according to one embodiment of the present invention. In operation, dual outlet nozzle 100 is preferably situated below semiconductor wafer 20, such that the nozzle is able to eject cleaning fluid onto the wafer backside 21 in order to wash the backside and also remove any edge bead from the wafer edge 22. Although primary longitudinal axis 101 is to be preferably oriented so as to be substantially perpendicular to the plane in which wafer 20 is spun, such an orientation is not absolutely necessary. Dual outlet nozzle 100 will typically eject fluid in two distinct backside cleaning fluid jets 162, although only one such jet (ejecting fluid sideways) is shown here for purposes of illustration.

Figure 8:
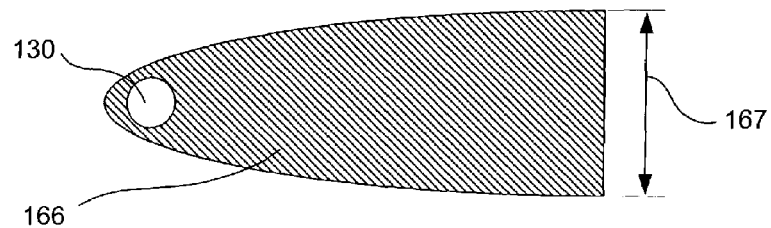
FIG. 8 illustrates an exemplary two-dimensional flow pattern produced by one outlet of the dual outlet nozzle shown in FIGS. 3-7.

Referring briefly to FIG. 8, an exemplary two-dimensional flow pattern produced by one outlet of the inventive dual outlet nozzle as shown in FIGS. 3-7 is illustrated. Such a cleaning fluid flow pattern 166 generally results on the backside of a wafer when cleaning fluid is dispensed at a cleaning fluid jet impact region 130. Such a fluid flow pattern can vary in accordance with several factors, such as the viscosity of the fluid used, the pressure and flow rate from the fluid jet, and the rotational speed of the wafer.

As shown in FIGS. 7, 8 and elsewhere throughout the figures, there exist several distances and angles involved with the dispensing of fluid by dual outlet nozzle 100. Such parameters include the vertical distance 163 from the nozzle outlet to the wafer backside, the horizontal distance 164 from the primary longitudinal axis 101 to the fluid jet impact region on the wafer, the ejection angle 165 of the fluid jet with respect to primary axis 101, and a fluid flow pattern terminal width 167. While the fluid flow pattern can expand slightly beyond this width, especially during any change in conditions, this terminal width 167 tends to be the width within which most fluid will flow for an extended length under a fixed set of conditions. These and other parameters are largely controllable by the specific angles, orientation, and position used in mounting the nozzle to the stationary EBR arm, and at least some of these parameters can be critical in implementing a more effective or optimized EBR and backside wash system.

An optimization of these parameters can vary, and such optimization will again be dependent on a variety of factors, such as, for example, the strength of the cleaning fluid, the power and volume of the cleaning fluid jets, the fluid pressure and flow rate, and the rotational speed of the spinning wafer. In one example, when EEP is being used as the cleaning fluid, the wafer is spinning at about 25 revolutions per minute (RPM), the fluid pressure is about 10 pounds per square inch (PSI) and the fluid flow rate is about 5 gallons per hour (GPH), then one optimized set of parameters can include a vertical distance 163 of about 3 millimeters (mm), a horizontal distance 164 of about 3 mm and an ejection angle of about 45 degrees, the entire foregoing of which will result in a terminal width 167 of about 4 mm. Other sets of parameter measurements can be possible under the same foregoing conditions as well to achieve an optimized EBR and backside wash system, and it will be readily appreciated that such parameter measurements tend to be interrelated. Alternative parameter measurements are especially likely, however, when one or more of the preceding conditions are altered. It is specifically contemplated that through use of the inventive dual outlet nozzle disclosed herein, any determination of such optimized parameter measurements will be readily apparent through routine experimentation when such preceding conditions are altered or changed.

Figure 9:
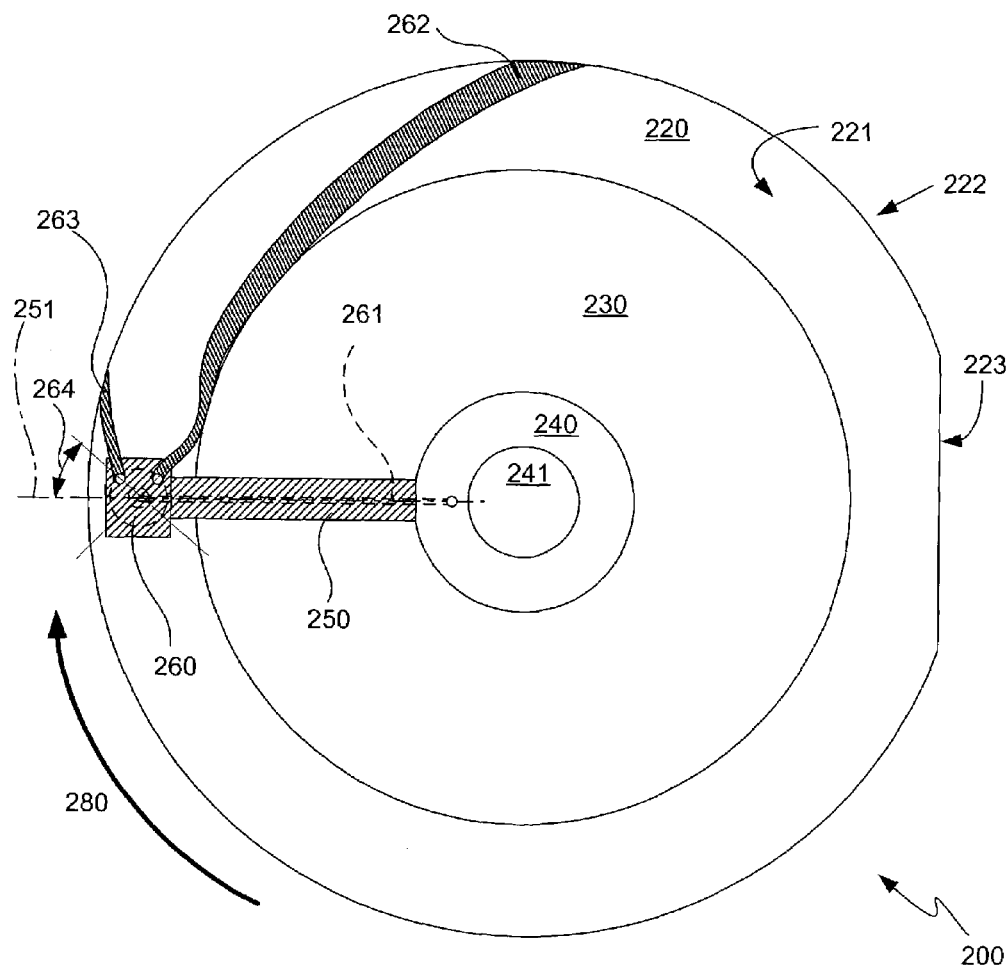
FIG. 9 illustrates in bottom plan view the dual outlet nozzle of FIG. 3 in operation within an edge bead removal and backside wash system according to one embodiment of the present invention.

Turning now to FIG. 9, the inventive dual outlet nozzle of FIGS. 3-8 is shown in bottom plan view in operation within an edge bead removal and backside wash system according to one embodiment of the present invention. Combined EBR and backside wash system 200 utilizing a dual outlet nozzle is adapted and configured for use with a semiconductor wafer 220 being processed within a process chamber, such as a CVD, PVD, spray coating or spin coating process chamber. Combined EBR and backside wash system 200 utilizes a dual outlet nozzle such that the semiconductor wafer backside 221, semiconductor wafer edge 222, and/or semiconductor wafer flat 223 can be more effectively cleaned after a processing step, such as a spin coating process step. Semiconductor wafer 220 is held in place atop chuck 230, which is supported by a stationary chuck support 240. A motor driven axle 241 is adapted to rotate at relatively high speeds, such that chuck 230 and wafer 220 are also rotated at relatively high speeds, both in rotation direction 280 with respect to the remaining system components.

Exactly one EBR stationary arm 250 having a primary axis 251 extends laterally from stationary chuck support 240, and is configured to support a dual outlet nozzle 260, which is substantially identical to dual outlet nozzle 100 as described previously. EBR cleaning fluid delivery line 261 preferably passes along or through EBR stationary arm 250 and stationary chuck support 240, such that EBR cleaning fluid can be delivered to both outlets of dual outlet nozzle 260. Once cleaning fluid or solvent, preferably EEP, reaches the nozzle outlets, it exits the nozzle and is dispensed onto wafer backside 221 in the form of two separate backside cleaning fluid or solvent jets. The first such jet results in a first backside cleaning fluid flow pattern 262, while the second such jet results in a second backside cleaning fluid flow pattern 263. Dual outlet nozzle 260 is oriented such that at least one jet results in a relative angle 264 with respect to primary axis 251 of stationary arm 250.

As will be readily appreciated, dual outlet nozzle 260, being substantially identical to the previously described dual outlet nozzle 100, likewise has exactly two outlets, which outlets are set apart from each other at a fixed angle of about 90 degrees. Although not shown, fixed angles of varying degrees and alternative numbers of outlets are also possible, with one example being three outlet holes, each separated by an angle of about 45 degrees. Alternatively, 5 outlet holes separated by angles of about 36 degrees are also possible. For purposes of convenience and illustration, however, the discussion herein has been for the most part confined to the illustrative example of two outlets separated by an angle of about 90 degrees.

While the fixed angle of about 90 degrees between nozzle outlet holes cannot usually be altered for any particular nozzle, it will be readily appreciated that the various angles and orientation of a dual outlet nozzle and its outlets with respect to the wafer can typically be adjusted. In one embodiment, for example, nozzle 260 can be adjusted with respect to spinning wafer 220 such that one nozzle outlet ejects solvent or fluid in a jet that projects generally inward toward the area where the wafer and chuck come into contact with each other (e.g., flow pattern 262), while the other nozzle outlet ejects solvent or fluid in a jet that projects generally outward toward the outer edge of the wafer (e.g., flow pattern 263). In such an instance, it is typically desirable to orient the nozzle such that the fluid jets spray according to a vector that has an upward component and a horizontal component that is in the general direction that the wafer is rotating, in order to minimize splash.

Because it is either impossible or impractical for outlets having a fixed relative angle of about 90 degrees to both effectively eject fluid directly in line with a tangent to the rotational direction of the wafer, one acceptable solution is to align the nozzle such that both outlets eject fluid in jets having about a 45 degree angle with respect to such a tangent, as shown in FIG. 9. In other words, dual outlet nozzle 260 is adapted to be mounted to the stationary EBR arm 250 so that it can be oriented such that each outlet ejects a fluid jet onto the backside of the wafer at an angle 264 of about 45 degrees with respect to a primary axis 251 of the stationary arm. In addition, it is important to note that the positioning of the second or outermost nozzle opening (which results in a fluid jet that produces fluid flow pattern 263) be within a radius that is transcribed by the shortest distance from the wafer center to the wafer flat region 223. Accordingly, fluid will still be ejected onto the wafer backside even as the wafer flat passes by the nozzle, such that fluid splash is thereby avoided.

When such a dual outlet nozzle has been implemented and oriented in this fashion, including all of the foregoing exemplary factors and parameter measurements and angles, such an implementation has been determined to result in up to a 60% reduction defects in the wafer backside, and almost a 100% reduction in defects in the wafer flat region. In addition, such a multiple outlet nozzle results in the elimination a need for any additional nozzles, as well as the additional fluid delivery lines, stationary arms and associated other supports that accompany such additional nozzles. Accordingly, a method of cleaning chemical residue from spin coated semiconductor wafers involving spinning a wafer within a plane, providing a semiconductor wafer cleaning system having one nozzle with a plurality of outlets configured for the ejection of cleaning fluid onto the semiconductor wafer in a direction that is distinct from the ejection direction of every other nozzle outlet, and ejecting cleaning fluid simultaneously in a plurality of distinct directions from that single nozzle has been found to be a substantial improvement over existing EBR and backside wash systems, in terms of both defect results and overall system cost.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. A method of cleaning chemical residue from spin coated semiconductor wafers, the method comprising:
   selecting a first semiconductor wafer to be cleaned;
   spinning said semiconductor wafer within a plane;
   providing a semiconductor wafer cleaning system, said semiconductor wafer cleaning system comprising a nozzle mounted to a stationary arm, said nozzle having exactly two outlets separated by an angle of about 90 degrees, wherein each of said two outlets is configured for the ejection of cleaning fluid onto the semiconductor wafer in a direction that is distinct from the ejection direction of the other nozzle outlet; and
   ejecting cleaning fluid simultaneously in two distinct directions from said two outlets of said nozzle.

2. The method of claim 1, wherein said nozzle is configured-such that each outlet ejects cleaning fluid onto said semiconductor wafer at an angle of about 45 degrees with respect to a primary axis of said stationary arm.

3. A method of cleaning chemical residue from spin coated semiconductor wafers, the method comprising:
   selecting a first semiconductor wafer to be cleaned;
   spinning said semiconductor wafer within a plane;
   providing a semiconductor wafer cleaning system, said semiconductor wafer cleaning system comprising a nozzle having a plurality of outlets, wherein each of said outlets is configured for the ejection of cleaning fluid onto the semiconductor wafer in a direction that is distinct from the ejection direction of every other nozzle outlet, and wherein at least one of said plurality of outlets is situated on a beveled top surface of said nozzle; and
   ejecting cleaning fluid simultaneously in a plurality of distinct directions from said nozzle.

4. The method of claim 3, wherein the angle of said beveled top surface with respect to a primary axis of said nozzle is about 45 degrees.

5. The method of claim 3, wherein said cleaning fluid comprises at least one fluid selected from the group consisting of ethoxypropanol, isopropyl alcohol, acetone, propylene glycol, and water.

6. A method for removing an edge bead of a coating material from the surface of a semiconductor wafer, comprising:
   spinning said semiconductor wafer within a substantially horizontal plane; and
   dispensing a solvent onto a plurality of locations on the backside of said semiconductor wafer,
      wherein said solvent is dispensed by a single nozzle mounted to a stationary arm, said nozzle having exactly two outlets separated by an angle of about 90 degrees, and
      wherein at least a portion of coating material on the backside or edge of said semiconductor wafer is removed.

7. The method of claim 6, wherein said nozzle is adapted to be mounted to a stationary arm such that each outlet ejects cleaning fluid onto said semiconductor wafer at an angle of about 45 degrees with respect to a primary axis of said stationary arm, and wherein at least one of said plurality of outlets is situated on a beveled top surface of said nozzle, said beveled top surface having an angle with respect to a primary axis of said nozzle of about 45 degrees.

8. A method for distributing fluid to a surface of a semiconductor wafer during a manufacturing process, comprising:
   selecting a first semiconductor wafer to be processed;
   positioning a nozzle at a first distance from a surface of said first semiconductor wafer and a second distance from an edge of said semiconductor wafer, said nozzle having exactly two outlets separated by an angle of about 90 degrees and adapted such that fluid can be ejected in a plurality of distinct directions from said nozzle simultaneously;
   mounting said nozzle to a stationary arm such that each of said outlets is adapted to eject fluid onto said first semiconductor wafer at an angle of about 45 degrees with respect to a primary axis of said stationary arm;
   spinning said first semiconductor wafer within a plane; and
   distributing said fluid to a plurality of locations on said surface of said first semiconductor wafer, wherein at least a portion of said fluid is ejected in a plurality of distinct directions from said nozzle simultaneously.

9. The method of claim 8, wherein at least one of said plurality of outlets is situated on a beveled top surface of said nozzle.

10. The method of claim 9, wherein said beveled top surface defines an angle with respect to a primary axis of said nozzle of about 45 degrees.

11. The method of claim 8, wherein said first distance is about 3 millimeters.

12. The method of claim 8, wherein said second distance is about 3 millimeters.

13. The method of claim 8, wherein at least one of said plurality of outlets ejects fluid into a fluid flow pattern having a terminal width of about 4 millimeters.

14. A method of conducting a simultaneous edge bead removal and backside wash of a spin coated semiconductor wafer, comprising:

spinning a semiconductor wafer within a substantially horizontal plane;

providing a semiconductor wafer cleaning system having a nozzle mounted to an edge bead removal stationary arm, said nozzle having a plurality of outlets, wherein each of said plurality of outlets is configured to eject cleaning fluid onto said semiconductor wafer in a direction that is distinct from the ejection direction of every other nozzle outlet, and wherein at least one of said plurality of outlets is situated on a beveled top surface of said nozzle; and dispensing a solvent onto the backside of said semiconductor wafer via said nozzle while said semiconductor wafer is spinning, wherein at least a portion of coating material on the backside of said semiconductor wafer is washed away via solvent dispensed from a first outlet of said plurality of outlets, and wherein at least a portion of coating material forming an edge bead on the edge of said semiconductor wafer is simultaneously removed via solvent dispensed from a second separate outlet from said plurality of outlets.

15. The method of claim 14, wherein said beveled top surface defines an angle with respect to a primary axis of said nozzle of about 45 degrees.

16. A method of conducting a simultaneous edge bead removal and backside wash of a spin coated semiconductor wafer, comprising:

spinning a semiconductor wafer within a substantially horizontal plane;

providing a semiconductor wafer cleaning system having a nozzle mounted to an edge bead removal stationary arm, said nozzle having a plurality of outlet, wherein each of said plurality of outlets is configured to eject cleaning fluid onto said semiconductor wafer in a direction that is distinct from the ejection direction of every other nozzle outlet; and wherein said plurality of outlets consists of exactly two outlets on said nozzle; and dispensing a solvent onto the backside of said semiconductor wafer via said nozzle while said semiconductor wafer is spinning, wherein at least a portion of coating material on the backside of said semiconductor wafer is washed away via solvent dispensed from a first outlet of said plurality of outlets, and wherein at least a portioh of coating material forming an edge bead on the edge of said semiconductor wafer is simultaneously removed via solvent dispensed from a second separate outlet from said plurality of outlets.

17. The method of claim 16, wherein said exactly two outlets are separated by an angle of about 90 degrees.

* * * * *

UNITED STATES PATENT AND TRADEMARK OFFICE
CERTIFICATE OF CORRECTION

PATENT NO. : 7,247,209 B2 Page 1 of 1
APPLICATION NO. : 10/461068
DATED : July 24, 2007
INVENTOR(S) : Robertson et al.

It is certified that error appears in the above-identified patent and that said Letters Patent is hereby corrected as shown below:

Col. 12, line 26, delete "portioh" and insert --portion--.

Signed and Sealed this

Thirtieth Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,247,209 B2 Page 1 of 1
APPLICATION NO. : 10/461068
DATED : July 24, 2007
INVENTOR(S) : Robertson et al.

It is certified that error appears in the above-identified patent and that said Letters Patent is hereby corrected as shown below:

On the title page,

[*] Notice: Subject to any disclaimer, the term of this patent is extended or adjusted under 35 USC 154(b) by (366) days Delete the phrase "by 366 days" and insert -- by 407 days --

Signed and Sealed this

Fourteenth Day of April, 2009

JOHN DOLL
*Acting Director of the United States Patent and Trademark Office*